United States Patent [19]
Cleveland

[11] Patent Number: 6,137,727
[45] Date of Patent: Oct. 24, 2000

[54] REDUCTION OF OXIDE STRESS THROUGH THE USE OF FORWARD BIASED BODY VOLTAGE

[75] Inventor: Lee Cleveland, Santa Clara, Calif.

[73] Assignee: Advanced Micro Devices, Inc., Sunnyvale, Calif.

[21] Appl. No.: 09/490,353

[22] Filed: Jan. 24, 2000

[51] Int. Cl.⁷ ................................................. G11C 16/04
[52] U.S. Cl. ............................. 365/185.27; 365/185.16; 365/185.17
[58] Field of Search ................. 365/185.27, 189.07, 365/185.17, 185.16

[56] References Cited

U.S. PATENT DOCUMENTS

| | | | |
|---|---|---|---|
| 5,042,009 | 8/1991 | Kazerounian et al. | 365/185 |
| 5,341,342 | 8/1994 | Brahmbhatt | 365/182 |
| 5,412,603 | 5/1995 | Schreck et al. | 365/189.01 |
| 5,511,022 | 4/1996 | Yim et al. | 365/185.17 |
| 5,646,886 | 7/1997 | Brahmbhatt | 365/185.16 |
| 5,770,963 | 6/1998 | Akaogi et al. | 327/309 |
| 5,991,203 | 11/1999 | Choi | 365/185.27 |

*Primary Examiner*—Richard Elms
*Assistant Examiner*—Tuan T. Nguyen
*Attorney, Agent, or Firm*—H. Donalo Nelson

[57] ABSTRACT

A method of reading a flash memory (EEPROM) device by applying zero to all bitlines except for the bitline to which the cell being read is attached, applying a positive voltage to the wordline to which the cell being read is attached and applying a positive voltage to the p-well in which the cell being read is formed. A positive voltage is applied to the bitline to which the cell being read is attached.

7 Claims, 3 Drawing Sheets

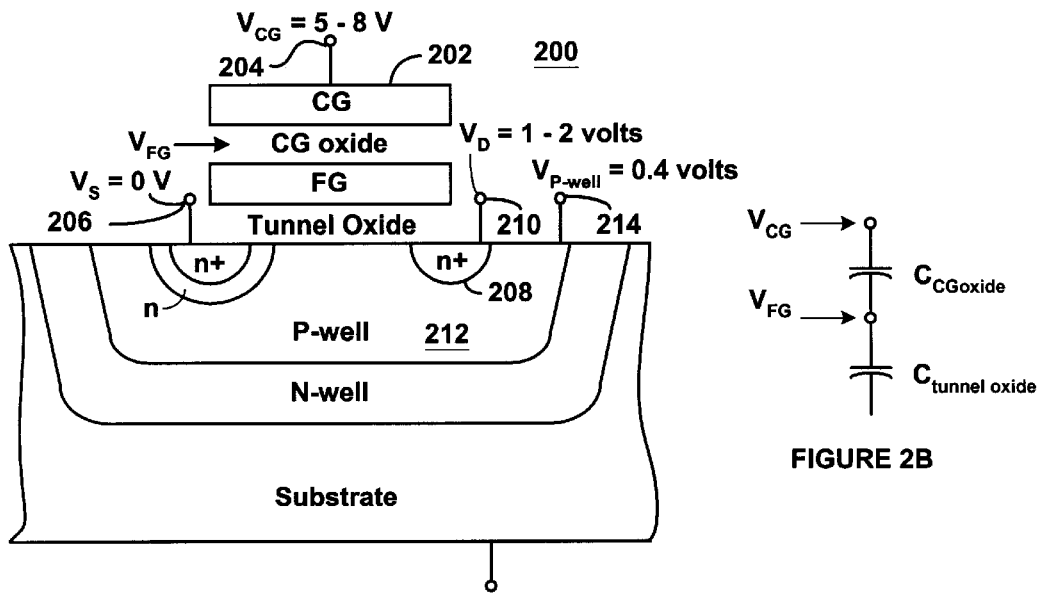
FIGURE 2A
FIGURE 2B
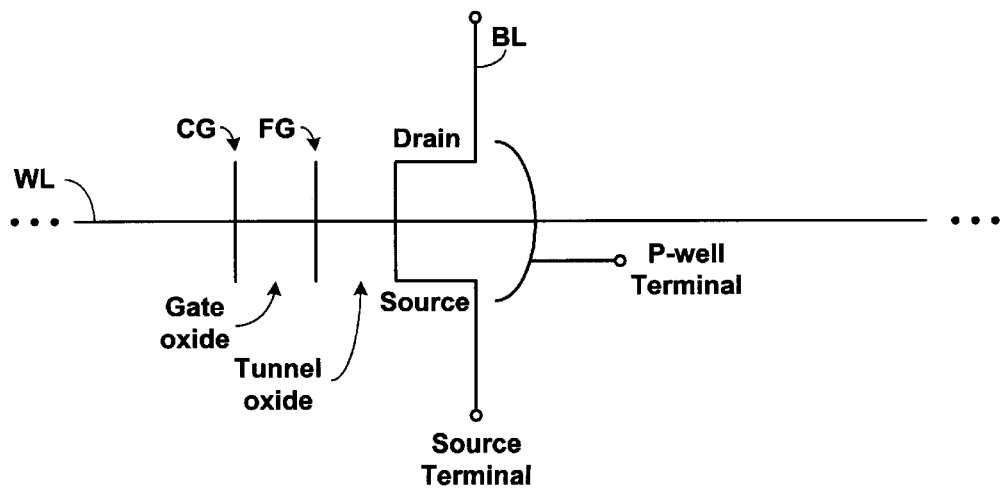
FIGURE 3A

6,137,727

REDUCTION OF OXIDE STRESS THROUGH THE USE OF FORWARD BIASED BODY VOLTAGE

BACKGROUND OF THE INVENTION

1. Field of the Invention

This invention relates generally to the art of microelectronic integrated circuits. More specifically, this invention relates to flash Electrically Erasable Programmable Read Only Memory (EEPROM) devices. Even more specifically, this invention relates to a method to read flash Electrically Erasable Programmable Read Only Memory (EEPROM) devices to reduce oxide stress.

2. Discussion of the Related Art

A microelectronic Electrically Erasable Programmable Read-Only Memory (Flash EEPROM) device includes an array of cells that can be independently programmed and read. The size of each cell and thereby the memory device are made small by omitting select transistors that would enable the cells to be erased independently. As a result, all of the cells must be erased simultaneously as a block.

A memory of this type includes individual Metal-Oxide-Semiconductor (MOS) field effect transistor memory cells, each of which includes a source, drain, floating gate and control gate to which various voltages are applied to program the cell with a binary "1" or "0" or to erase all of the cells as a block.

The cells are connected in a rectangular array of rows and columns, with the control gates of the cells in a row being connected to a respective wordline and the drains of the cells in a column being connected to a respective bitline. The sources of the cells are connected together to a common source. This arrangement is known as a NOR memory configuration.

A cell is programmed by applying typically 8–9 volts to the control gate, approximately 5 volts to the drain and grounding the source, which causes hot electrons to be injected from the drain depletion region into the floating gate. Upon removal of the programming voltages, the injected electrons are trapped in the floating gate and create a negative charge therein that increases the threshold voltage of the cell to a value in excess of approximately 4 volts.

A cell can be erased in several ways. In one arrangement, applying typically 12 volts to the source, grounding the control gate and allowing the drain to float erases a cell. This causes the electrons that were injected into the floating gate during programming to be removed by Fowler-Nordheim tunneling from the floating gate through the thin tunnel oxide layer to the source. Alternatively, applying a negative voltage on the order of minus 10 volts to the control gate, applying 5 volts to the source and allowing the drain to float can erase a cell.

The cell is read by applying typically 5 volts to the control gate, 1–2 volts to the bitline to which the drain is connected, grounding the source, and sensing the bitline current. If the cell is programmed and the threshold voltage is relatively high ($\approx 4$ volts), the bitline current will be zero or at least relatively low. If the cell is not programmed or erased, the threshold voltage will be relatively low ($\approx 2$ volts), the control gate voltage will enhance the channel, and the bitline current will be relatively high.

During read the voltages applied to the terminals cause oxide stress in the memory cell. Oxide stress can cause electrons to tunnel across the tunnel oxide to the floating gate. This causes the threshold voltage, $V_t$, to increase and is referred to as charge gain. The cause of the oxide stress is the control gate voltage that is applied causes current to flow in the cell and is given approximately by the equation $$I = k(V_{GS} - V_t)^n,$$

where $V_{GS}$ is the voltage from the gate to the source, k is a proportional constant and $V_t$ is the threshold voltage of the cell. It can be seen from the equation that increasing $V_{GS}$ increases I. Unfortunately, increasing $V_{GS}$ also increases the oxide stress as can be seen from the equation for the oxide voltage $V_{FG}$. The voltage $V_{FG}$ is proportional to the control gate voltage $V_{CG}$ as follows:

$$V_{FG} \sim V_{CG} \, (C_{gate\ oxide})/(C_{gate\ oxide} + C_{tunnel\ oxide})$$

where $C_{gate\ oxide}$ is the capacitance of the gate oxide and $C_{tunnel\ oxide}$ is the capacitance of the tunnel oxide. The control gate voltage $V_{CG} \sim V_{GS} =>$ oxide stress voltage $-V_{FG} \sim V_{GS} (C_{gate\ oxide})/(C_{gate\ oxide} + C_{tunnel\ oxide})$. To properly read the cell a certain minimum current is required. From the equation, $$I = k(V_{GS} - V_t)^n,$$

the voltage $V_{GS}$ would need to be some minimum value. Another alternative to maintain the current and reducing $V_{GS}$ would be to decrease $V_t$. The direct way to do this would be to increase the positive charge on the floating gate. In that case $V_{FG}$ would increase and the oxide stress would increase so this alternative would not be a good approach.

Therefore, what is needed is a method of reducing the $V_t$ without increasing the oxide stress.

SUMMARY OF THE INVENTION

According to the present invention, the foregoing and other objects and advantages are achieved by a method of reading a flash Electrically-Erasable Programmable Read Only Memory (EEPROM) that reduces the oxide stress.

In accordance with an aspect of the present invention, a positive voltage is applied to the bitline to which the cell being read is attached, a positive voltage is applied to the wordline to which the cell being read is attached and a positive voltage is applied to the p-well to which the cell being read is attached.

In accordance with another aspect of the present invention, the positive voltage applied to the bitline to which the cell being read is attached is between 1 and 2 volts. The positive voltage applied to the wordline to which the cell being read is attached is between 5 and 8 volts and the positive voltage applied to the p-well is approximately 0.4 volts.

In accordance with another aspect of the present invention, zero volts is applied to the bitlines to which the cell being read is not attached and to wordlines to which the cell being read is not attached. In addition, zero volts is applied to the common source terminal.

The described method thus provides a method of reading a flash memory cell that reduces the oxide stress during read operation.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

FIG. 2A shows a single flash memory cell with read voltages applied to the terminals of the flash memory cell in accordance with the present invention;

FIG. 2B illustrates the control gate voltage and the floating gate voltage in relation to the capacitance of the gate oxide and capacitance of the tunnel oxide;

FIG. 3A shows a single flash memory cell illustrating the connections to the terminals of the flash memory cell.

DETAILED DESCRIPTION

Reference is now made in detail to specific embodiments of the present invention that illustrate the best mode presently contemplated by the inventors for practicing the invention.

Figure 1A:
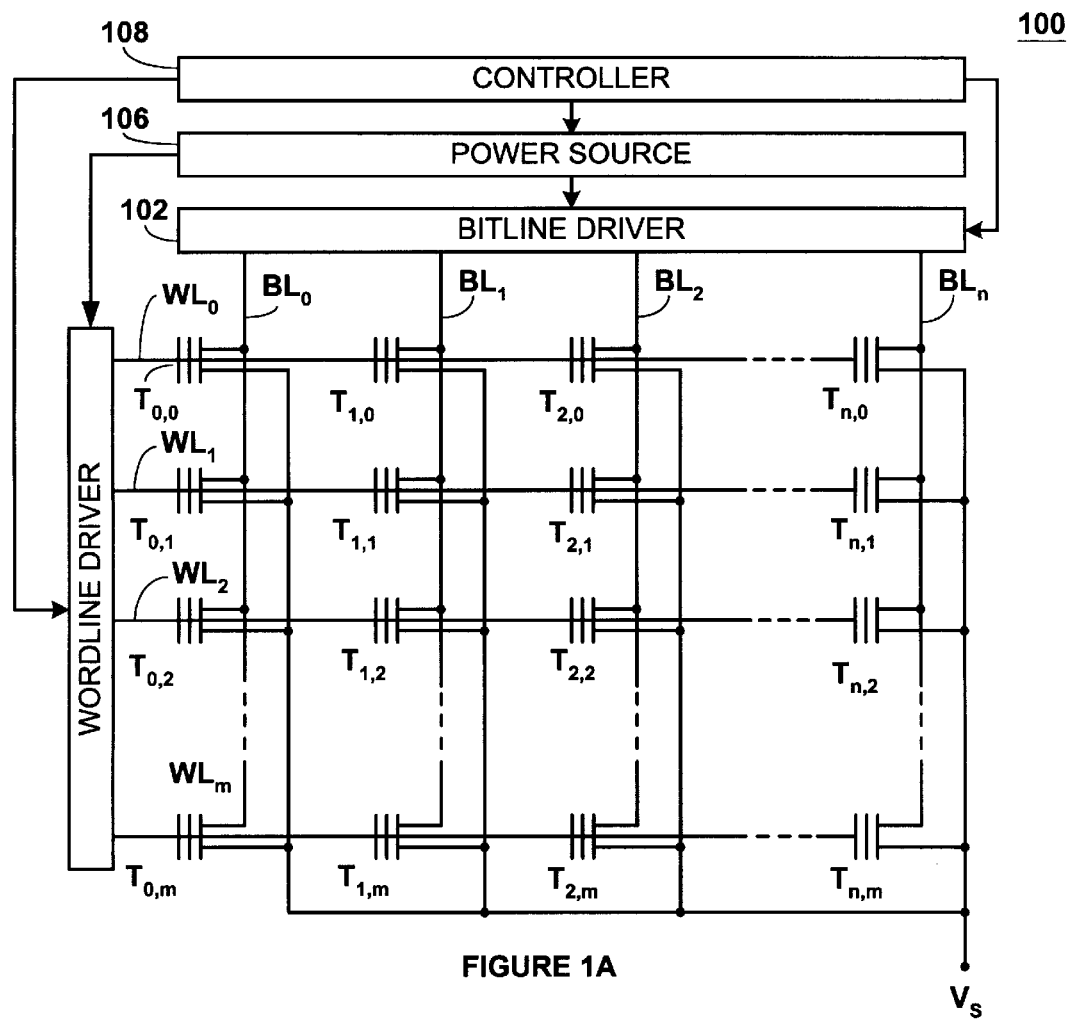
FIG. 1A is a simplified electrical schematic diagram of a flash EEPROM device showing an array of memory cells and control elements.

FIG. 1A illustrates the basic configuration of a NOR type flash Electrically Erasable Programmable Read-Only Memory (EEPROM) device 100 to which the present invention is advantageously applied. The memory device 100 is a plurality of core or memory cells that are arranged in a rectangular matrix or array of rows and columns. Each row is associated with a wordline, whereas each column is associated with a bitline. The sources of all of the memory cells are connected to a common terminal, $V_S$.

Assuming that there are n columns and m rows, the bitlines are designated $BL_0$ to $BL_n$ and the wordlines are designated as $WL_0$ to $WL_m$. A bitline driver 102 applies appropriate voltages to the bitlines, whereas a wordline driver 104 applies appropriate voltages to the wordlines. The voltages applied to the drivers 102 and 104 are generated by a power source or supply 106 under the control of a controller 108 that is typically on-chip logic circuitry. The controller 108 also controls the drivers 102 and 104 to address the memory cells individually or collectively as will be described below.

A memory cell is located at each junction of a wordline and a bitline. Each cell includes a Metal-Oxide-Semiconductor (MOS) Field-Effect-Transistor (FET) having a source, drain, gate oxide and control gate. The cells of a flash EEPROM differ from conventional FETs in that they additionally include a floating gate and tunnel oxide layer disposed underneath the control gate.

The cells illustrated in FIG. 1A are designated using the notation $T_{n,m}$, where m is the row (wordline) number and n is the column (bitline) number. The control gates of the cells are connected to respective wordlines, and the drains of the cells are connected to respective bitlines as illustrated. The sources of all of the cells are connected to the common terminal $V_S$, which is connected to the power supply 106. The connection to the power supply 106 is not shown.

Figure 1B:
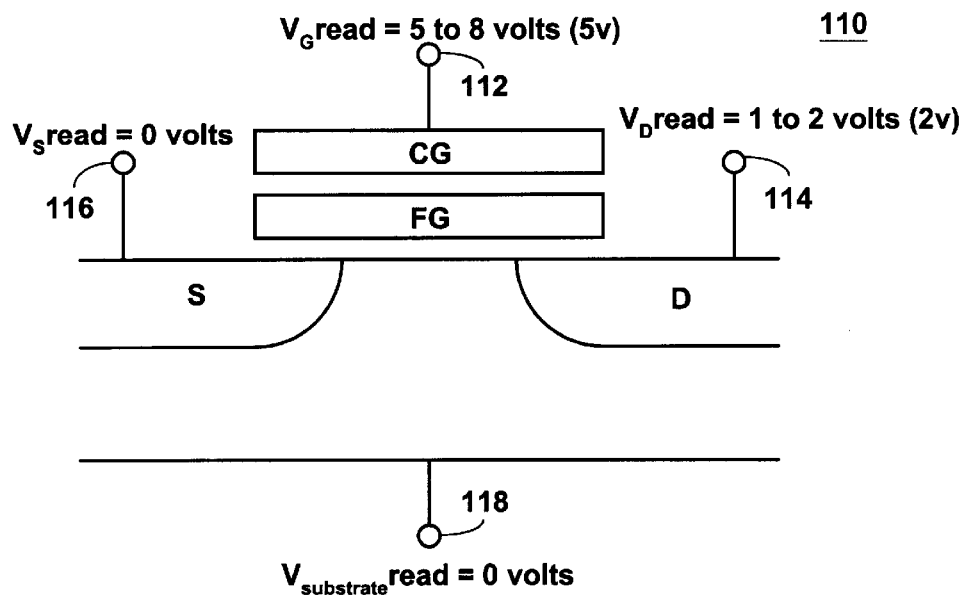
FIG. 1B shows a single flash memory cell with read voltages applied to the terminals of the flash memory cell in accordance with the prior art.

FIG. 1B shows a single flash memory cell 110 with read voltages applied to the terminals of the flash memory cell 110 during a read operation in accordance with the prior art. During read, a read voltage typically of from 5 to 8 volts is applied to the terminal 112 via the wordline attached to the gate of the cell being read. A read voltage of 1 to 2 volts is applied to the terminal 114 via the bitline attached to the drain of the cell being read. Zero voltage is applied to the source terminal 116 via a line that is attached to a common terminal. As is known in the flash memory art, all of the sources are connected to a common terminal. Zero voltage is applied to the terminal 118 that is connected to the substrate, which is also common to all the cells in the device. As can be appreciated, a voltage differential of from 5–8 volts is applied between the gate terminal and source terminal of all of the bits attached to the wordline of the cell being read. As discussed above, the relatively high gate-to-source voltage can cause stress in the tunnel oxide that results in electrons being leaked to the floating gate causing a charge gain.

FIG. 2A shows a single flash memory cell 200 with read voltages applied to the terminals of the flash memory cell 200 in accordance with the present invention. During read, a voltage of typically 5 to 8 volts is applied to the control gate 202 via terminal 204. The source is grounded (0 volts) as indicated at 206, a voltage of 1 to 2 volts is applied to the drain 208 via terminal 210 and a voltage of approximately 0.4 volts is applied to the P-well 212 via terminal 214. From the equation for threshold voltage $V_t \sim V_{FG} - \sqrt{\theta} V_{SB}$ where $V_{SB}$ is voltage difference between the source and body (p-well). Therefore, if $V_{source}$ is zero and $V_{body}$ is 0.4 volts, the threshold voltage $V_t$ decreases. Therefore, $V_{CG}$ decreases, which decreases $V_{FG}$ and the oxide stress, but since $V_t$ also decreases the minimum required current level necessary to read the cell will be maintained.

FIG. 2B illustrates the control gate voltage $V_{CG}$ and the floating gate voltage $V_{FG}$ in relation of the capacitance of the gate oxide $C_{CGoxide}$ and capacitance of the tunnel oxide $C_{tunnel\ oxide}$. $V_{FG} \sim V_{CG} (C_{gate\ oxide})/(C_{gate\ oxide} + C_{tunnel\ oxide})$.

FIG. 3A is a single flash memory cell 300 illustrating the connections to the terminals of the flash memory cell 300.

Figure 3B:
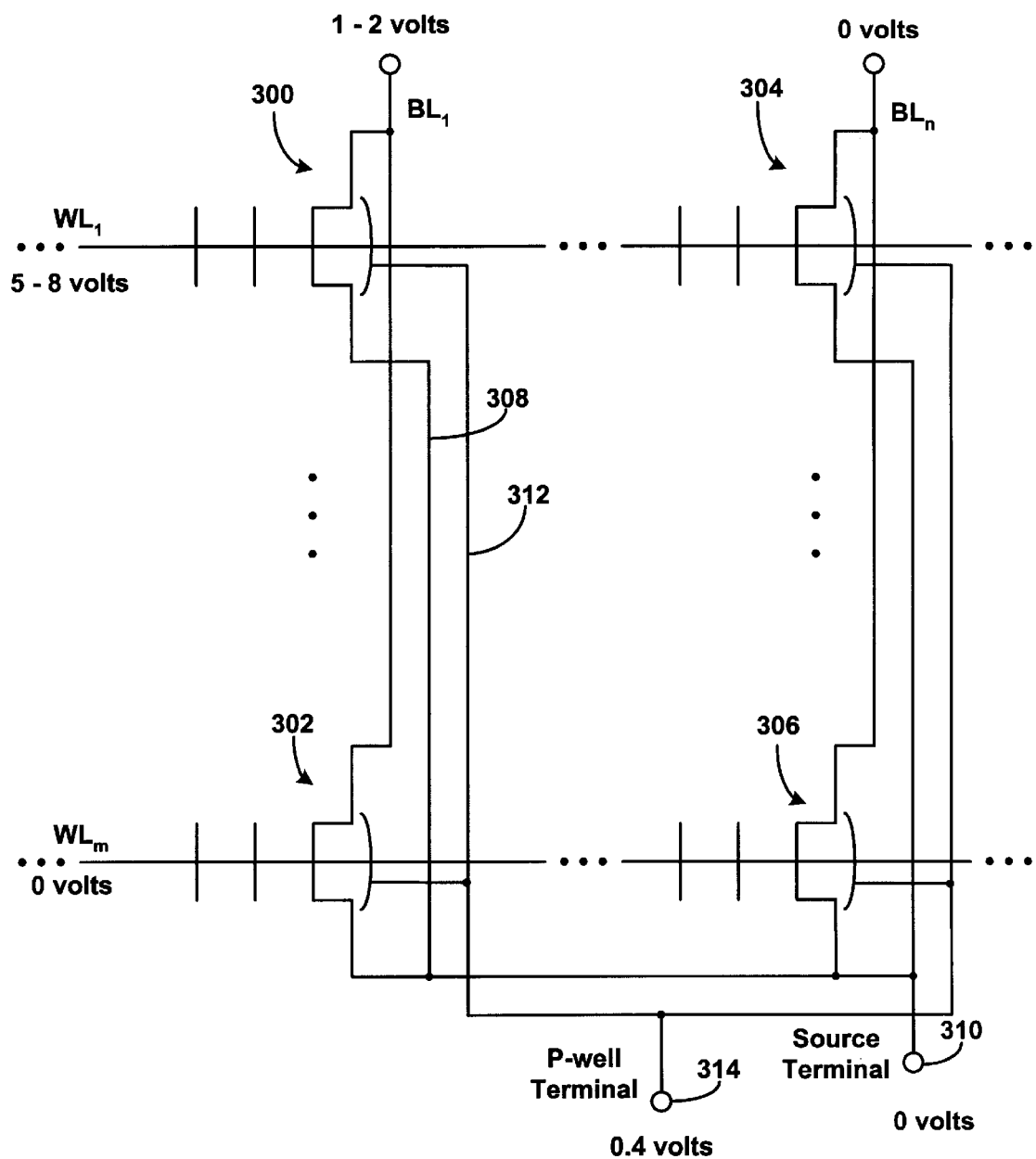
FIG. 3B is a simplified electrical schematic diagram of several flash EEPROM cells showing voltages applied to the terminals of the several flash memory cells during read.

FIG. 3B is a simplified electrical schematic diagram of several flash EEPROM cells as shown in FIG. 3A showing the voltages applied to the terminals of the flash memory cells during the reading of one of the flash memory cells. Shown in FIG. 3B are two wordlines $WL_1$ and $WL_m$ and two bitlines $BL_1$ and $BL_n$. At the intersection of each wordline and each bitline is located a memory cell, such as memory cell 300. Wordline $WL_1$ is connected to the control gate of memory cell 300 and the control gate of memory cell 304 and to the control gates of all memory cells in between. Similarly, wordline $WL_m$ is connected to the control gate of memory cell 302 and to the control gate of memory cell 306 and to the control gates of all memory cells in between. Bitline $BL_1$ is connected to the drains of memory cell 300 and memory cell 302 and the drains of all memory cells in between. Similarly, bitline $BL_n$ is connected to the drains of memory cell 304 and memory cell 306 and the drains of all memory cells in between. Lines 308 electrically connect the sources of all memory cells to a common terminal 310.

Lines 312 electrically connect the P-wells of all the memory cells to a common terminal 314.

To read memory cell 300, a voltage of between 5 and 8 volts is applied to $WL_1$, a voltage of 0 volts is applied to the remaining bitlines including $WL_m$. A voltage of 1 to 2 volts is applied to $BL_1$ and a voltage of 0 volts is applied to the remaining bitlines including $BL_n$. The common source terminal 310 is connected to ground (0 volts) and a positive voltage of approximately 0.4 volts is applied to the common P-well terminal 314.

In summary, the present invention overcomes the limitations of the prior art and fulfills the need for a method of reading a flash memory cell that reduces the oxide stress during the read operation.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of reading a flash memory Electrically-Erasable Programmable Read-Only Memory (EEPROM) memory cell in a flash memory device that includes a multitude of field effect transistor memory cells each having a source electrically connected to a common source terminal, a drain electrically connected to a bitline, a floating gate, a control gate electrically connected to a wordline, a p-well electrically connected to a common p-well terminal, and a substrate, the method comprising:

(a) applying a positive voltage to the bitline to which the cell being read is attached;

(b) applying a positive voltage to the wordline to which the cell being read is attached;

(c) applying zero volts to the common source terminal; and (d) applying a positive voltage to the common p-well terminal.

2. The method of claim 1 wherein the positive voltage applied in step (a) is between 1 and 2 volts.

3. The method of claim 2 wherein the positive voltage applied in step (b) is between 5 and 8 volts.

4. The method of claim 3 wherein the positive voltage applied in step (d) is approximately 0.4 volts.

5. The method of claim 4 further comprising (e) applying zero volts to the bitlines to which the cell being read is not attached.

6. The method of claim 5 further comprising (f) applying zero volts to the wordlines to which the cell being read is not attached.

7. The method of claim 6 further comprising (g) applying zero volts to a terminal electrically connected to the substrate.

* * * * *